United States Patent
Li et al.

(10) Patent No.: US 12,424,920 B2
(45) Date of Patent: Sep. 23, 2025

(54) CIRCUIT WITH POWER TRANSISTOR AND CURRENT SENSE THAT USES CONTROL DRIVE AS POWER SOURCE

(71) Applicant: Infineon Technologies Canada Inc., Ottawa (CA)

(72) Inventors: Yalong Li, Allen, TX (US); Yinglai Xia, Plano, TX (US); Robert Wayne Mounger, Dallas, TX (US); Nan Xing, Allen, TX (US); Edward MacRobbie, Nepean (CA); Zhemin Zhang, Allen, TX (US)

(73) Assignee: Infineon Technologies Canada Inc., Ottawa (CA)

( * ) Notice: Subject to any disclaimer, the term of this patent is extended or adjusted under 35 U.S.C. 154(b) by 250 days.

(21) Appl. No.: 18/309,651

(22) Filed: Apr. 28, 2023

(65) Prior Publication Data
US 2024/0364201 A1  Oct. 31, 2024

(51) Int. Cl.
*H02M 3/156* (2006.01)
*H02M 1/00* (2006.01)
*H02M 1/08* (2006.01)

(52) U.S. Cl.
CPC ........... *H02M 1/0009* (2021.05); *H02M 1/08* (2013.01); *H02M 3/156* (2013.01)

(58) Field of Classification Search
CPC ...... H02M 3/158; H02M 3/156; H02M 3/155; H02M 3/07; H02M 3/1588; H02M 3/33507; H02M 1/08; H02M 1/32; H02M 1/088; H02M 1/0009; H02M 1/0006; G05F 1/575; G05F 1/56; G05F 1/573
See application file for complete search history.

(56) References Cited

U.S. PATENT DOCUMENTS 10,818,786 B1    10/2020   Udrea et al.
2016/0087622 A1*  3/2016   Kaeriyama ........ H03K 17/0828
                                           327/109

(Continued)

FOREIGN PATENT DOCUMENTS

EP    4027520 A1    7/2022

OTHER PUBLICATIONS

European Search Report for application No. received for 24172729.6-1211 Sep. 13, 2024, 8 pages.

*Primary Examiner* — Bryan R Perez
(74) *Attorney, Agent, or Firm* — WORKMAN NYDEGGER

(57) ABSTRACT

A circuit that includes a power transistor and at least one sense transistor and that uses the control drive terminal to not only control the power transistor and the sense transistor, but also to provide power to a current sense circuit. The control nodes of the power transistor and sense transistor are connected, and the input nodes of the power transistor and the sense transistor are also connected. The current sense circuit is connected to the sense transistor control node and is configured to detect current passing through the sense transistor. The current sense circuit is also connected to the control drive terminal and is configured to draw power from the control drive terminal when a high control signal is present on the control drive terminal. Accordingly, the current sense circuit does not require an independent fixed high voltage supply in order to operate.

7 Claims, 2 Drawing Sheets

(56) References Cited

U.S. PATENT DOCUMENTS

2016/0293693 A1* 10/2016 Niimura .............. H10D 62/393
2019/0140630 A1    5/2019 Chen et al.
2022/0376100 A1   11/2022 Yang et al.

* cited by examiner

CIRCUIT WITH POWER TRANSISTOR AND CURRENT SENSE THAT USES CONTROL DRIVE AS POWER SOURCE

BACKGROUND OF THE INVENTION

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current—hence the term "field-effect transistor".

Nevertheless, there are other types of transistors. In each transistor, current flows from an input node to an output node through a channel when the transistor is "turned on" by applying a sufficient voltage to a control node. For instance, in a field-effect transistor, the control node would be the gate terminal, the input node would be one of the source or drain terminals, and the output node would be the other of the source or drain terminals.

Typical transistors are used for amplifying and switching purposes in electronic circuits. On the other hand, power transistors are used to convey more substantial current, have higher voltage ratings, and may more typically be used in power supplies, battery charging, and the like. Power transistors can typically operate with currents greater than 1 amp to as much as a hundred amps or even greater. Power transistors may convey power greater than 1 watt to as many as hundreds of watts or even greater. Nonetheless, measurement of current passing through a power transistor can be beneficial.

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to a circuit that includes a power transistor and at least one sense transistor. The power transistor has a power transistor control node that controls whether current flows from a power transistor input node to a power transistor output node. The sense transistor has a sense transistor control node that controls whether current flows from a sense transistor input node to a sense transistor output node. The sense transistor control node is connected to the power transistor control node, and the sense transistor input node is connected to the power transistor input node.

The circuit also includes a control drive terminal connected to the power transistor control node and the sense transistor control node. A current sense circuit is connected to the sense transistor control node and is configured to detect current passing through the sense transistor. The current sense circuit is also connected to the control drive terminal and is configured to draw power from the control drive terminal when a high control signal is present on the control drive terminal. Accordingly, the current sense circuit does not require an independent fixed high voltage supply in order to operate. Thus, the circuit also likewise does not require a fixed high voltage supply rail and thus also does not require a terminal or pin for such a high voltage supply rail. This significantly simplifies the packaging of the circuit, and allows for the circuit to be used where a high voltage supply rail is not readily available.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the systems and methods described herein can be obtained, a more particular description of the embodiments briefly described above will be rendered by reference to specific embodiments thereof which are illustrated in the appended drawings. Understanding that these drawings depict only typical embodiments of the systems and methods described herein, and are not therefore to be considered to be limiting of their scope, certain systems and methods will be described and explained with additional specificity and detail through the use of the accompanying drawings in which.

DETAILED DESCRIPTION

Embodiments described herein relate to a circuit that includes a power transistor and at least one sense transistor. The power transistor has a power transistor control node that controls whether current flows from a power transistor input node to a power transistor output node. The sense transistor has a sense transistor control node that controls whether current flows from a sense transistor input node to a sense transistor output node. The sense transistor control node is connected to the power transistor control node, and the sense transistor input node is connected to the power transistor input node.

The circuit also includes a control drive terminal connected to the power transistor control node and the sense transistor control node. A current sense circuit is connected to the sense transistor control node and is configured to detect current passing through the sense transistor. The current sense circuit is also connected to the control drive terminal and is configured to draw power from the control drive terminal when a high control signal is present on the control drive terminal. Accordingly, the current sense circuit does not require an independent fixed high voltage supply in order to operate. Thus, the circuit also likewise does not require a fixed high voltage supply rail and thus also does not require a terminal or pin for such a high voltage supply rail. This significantly simplifies the packaging of the circuit, and allows for the circuit to be used where a high voltage supply rail is not readily available.

Figure 1:
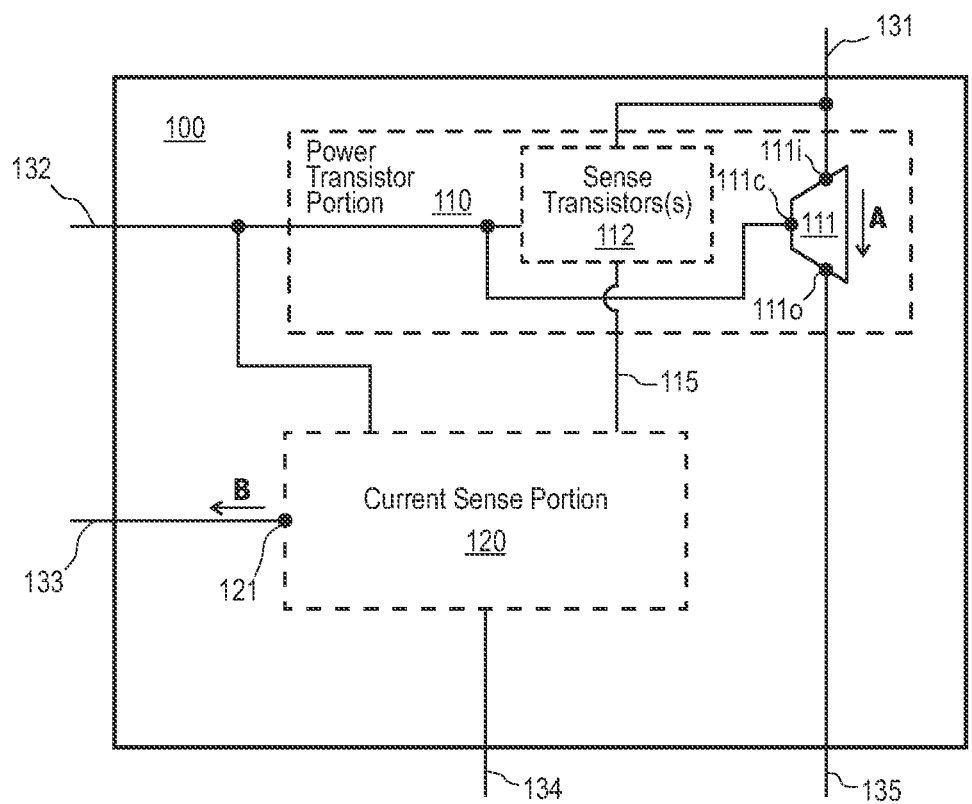
FIG. 1 illustrates a circuit in accordance with one aspect described herein, and which includes a power transistor portion that includes a power transistor and one or more sense transistors, and a sense current portion that senses current passing through the power transistor, the sense current portion operating without a high voltage supply provided by a high voltage supply rail.

FIG. 1 illustrates a circuit 100 in accordance with one aspect described herein. The circuit 100 includes a power transistor portion 110, a current sense portion 120, and various terminals 131 through 135 (referred to collectively as "terminals 130"). In accordance with the principles described herein, the terminals 130 do not include a positive voltage supply rail terminal for supplying a fixed positive supply voltage (e.g., $V_{dd}$), to the circuit 100.

The power transistor portion 110 includes, inter alia, a power transistor 111. Because the principles described herein are not limited to the type of the power transistor 111, the power transistor is represented symbolically as a trapezoid. As an example only, the power transistor 111 may be a field-effect transistor. In this description and in the claims, a "power transistor" is a transistor that is capable of transmitting more than one watt of power.

The power transistor 111 includes a control node 111c and input node 111i and an output node 111o. In operation, when a turn-on signal is applied to a control node 111c of the power transistor 111, current (represented by arrow A) is permitted to flow from the input node 111i of the power transistor 111 to the output node 111o of the power transistor 111. On the other hand, when a turn-off signal is applied to the control node 111c of the power transistor 111, no current (or negligible current) flows from the input node 111i to the output node 111o. In an example in which the power transistor 111 is a field-effect transistor, the control node 111c is a gate terminal, the input node 111i is a drain terminal, and the output node 111o is a source terminal of the power field-effect transistor. The power transistor portion 110 also includes one or more current sense transistors 112 that will later be described.

The current sense portion 120 is connected (as represented by connection 115) to the power transistor portion 110, and more specifically to the one or more current sense transistors 112. In operation, the current sense portion 120 outputs a sense current signal B on an output node 121 of the current sense portion 120. The sense current signal B represents (e.g., is proportional to) the current A passing through the power transistor 111.

The terminals 130 includes an input voltage terminal 131, a control drive terminal 132, a current sense terminal 133, a low voltage supply rail terminal 134, and a power ground terminal 135. In the case of the circuit 100 being a circuit package, the terminals 130 may be pins or bond pads of the package.

The terminals 130 do not need to include a high voltage supply rail terminal. Accordingly, the entirety of the circuit 100 may operate without a high voltage supply provided by a high voltage supply rail—sometimes referred to as $V_{dd}$. However, even if the circuit 100 does include a high voltage supply rail terminal, the current sense portion 120 operates without a high voltage provided by such a high voltage supply rail.

The input voltage terminal 131 is connected to the input node 111i of the power transistor 111, and in operation provides an input voltage to the input node 111i. In the case of the power transistor 111 being a field-effect transistor, the input voltage terminal 131 may be a drain terminal that provides a drain voltage to the drain terminal of the power field-effect transistor. In the case of power electronics and the power transistor being a power field-effect transistor, and the power transistor 111 being off, that drain voltage may be hundreds of volts. In some embodiments, the input voltage terminal 131 is also connected to an input node of each of the current sense transistor(s) 112 to provide the input voltage also to each of the current sense transistor(s) 112.

The control drive terminal 132 is connected to the control node 111c of the power transistor 111, and in operation provides a control drive voltage to the control node 111c to thereby turn the power transistor 111 on and off as appropriate. In the case of the power transistor 111 being a field-effect transistor, the control drive terminal 132 may be a gate terminal and provide a gate voltage to the gate terminal of the power field-effect transistor. As an example, if the power transistor 111 is an enhancement mode transistor, the power transistor 111 is normally off if zero voltage is applied to the control node 111c, and is on if a sufficient positive voltage is applied to the control node 111c. If the power transistor 111 is a depletion mode transistor, the power transistor 111 is normally on if zero voltage is applied to the control node 111c, and is off if a negative voltage is applied to the control node 111c. In some embodiments, the control drive terminal 132 is also connected to the current sense transistor(s) 112 to provide the control drive voltage also to each of the current sense transistor(s) 112.

The current sense terminal 133 is connected to the output node 121 of the current sense portion 120 and receives the signal B that represents the current A passing through the power transistor 111. For instance, the signal B may be a current or voltage signal that is proportional to the magnitude of the current A.

The low voltage supply rail terminal 134 provides a low voltage supply to the circuit 100, and in particular provides a low voltage supply to the current sense portion 120. Sometimes that low voltage supply is referred to as $V_{cc}$, and in many cases may be ground, or zero volts.

A power ground terminal 135 is connected to the output node 111o of the power transistor. In the case of the power transistor 111 being a field-effect transistor, the power ground terminal 135 is connected to the source terminal of the power field-effect transistor. The low voltage rail terminal 134 and the power ground terminal 135 are shown as separate terminals as the requirements for each may be different. That is, the power ground terminal 135 may connect to a sink that is capable of handling large amounts of current that are passed through the power transistor 111. On the other hand, the low voltage rail terminal 134 is connected to the current sense portion 120 and is not required to pass such high amounts of current. That said, in other embodiments, the low voltage supply rail terminal 134 and the power ground terminal 135 may be a single terminal.

In the illustrated case, there is no resistor element between the output node 111o of the power transistor 111 and the power ground terminal 135. In this description and in the claims, a "resistor element" is a circuit element that has a designed resistance, either fixed or variable. A "resistor element" as the term is used herein is not a parasitic resistance that occurs in any conductor. Accordingly, in FIG. 1, a conductor connects the output node 111o and power ground terminal 135. That conductor would of course have some level of parasitic resistance. Nonetheless, in the illustrated embodiment, there is no resistor element (as the term "resistor element" is used herein) between the output node 111o of the power transistor 111 and the low voltage supply rail terminal 134.

Rather than be powered with a high voltage supply provided on a high voltage supply rail, the current sense portion 120 is powered by a fluctuating control voltage applied to a control drive terminal. Specifically, the control drive terminal 132 is connected to the control node 111c of the power transistor 111. But rather than just serving to control the power transistor 111, the control drive terminal 132 also provides power to the current sense portion 120. This is so even though the control drive terminal 132 carries a control signal that fluctuates. The current sense portion 120 is thus powered only when the control signal on the control drive terminal 132 is high, and thus outputs the signal B using that power only when the control signal is high. When the control signal is low, there is no current A and thus the current sense portion 120 may be configured to respond to a lack of power by generating no signal, which itself can be interpreted as an indication of the amount of current A passing through the power transistor 111 when the power transistor 111 is off.

Figure 2:
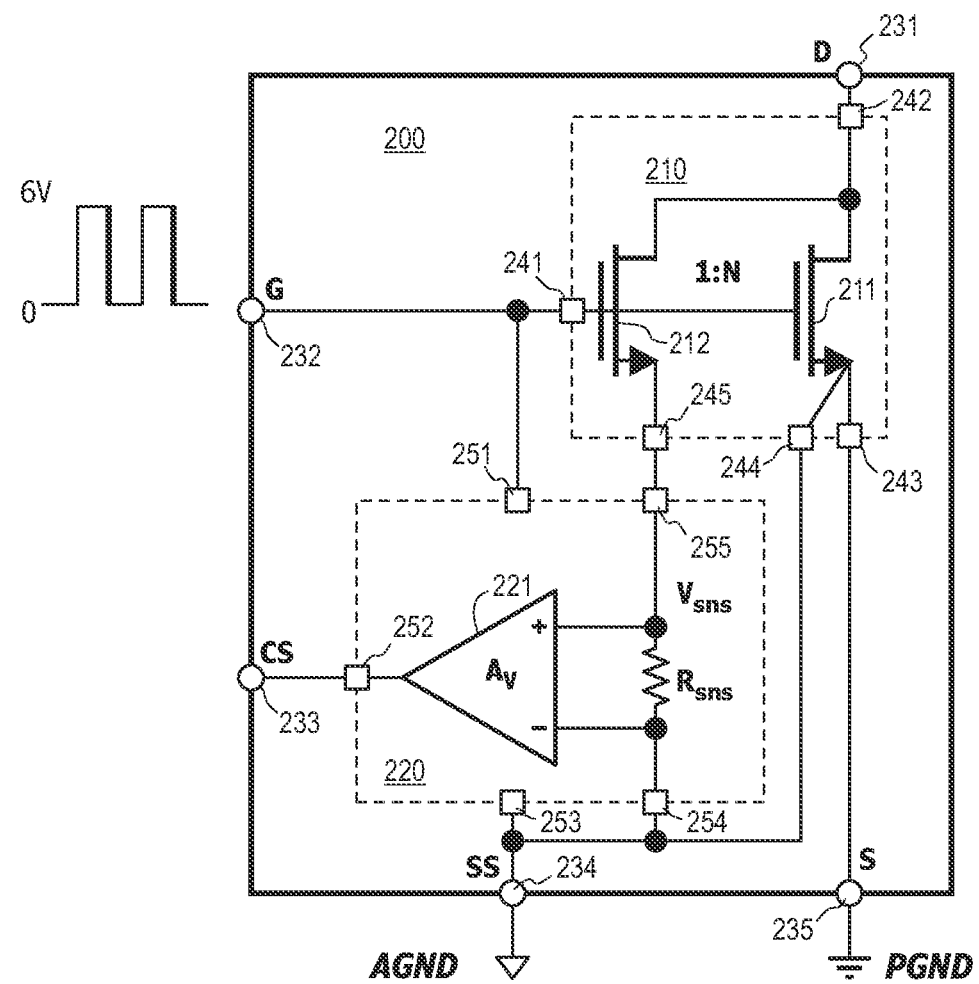
FIG. 2 illustrates a circuit that is a more specific example of the circuit of FIG. 1.

FIG. 2 illustrates a circuit 200 that is a more specific example of the circuit 100 of FIG. 1. The circuit 200 includes a power field-effect transistor 211 which is an example of the power transistor 111 of FIG. 1. The circuit 200 also includes a sense field-effect transistors 212, which is an example of the one or more sense transistor(s) 112 of FIG. 1. The die 210 is an example of the power transistor portion 110 of FIG. 1, and may also be referred to herein as a "power transistor die" 210. The die 220 is an example of the current sense portion 120 of FIG. 1, and may also be referred to herein as a "current sense die" 220.

Being on the same die, the power transistor 211 and the sense transistor 212 may be manufactured on the same semiconductor substrate. As an example, the power transistor 211 and the sense transistor 212 may each encompass a corresponding part of an epitaxial stack built on that semiconductor substrate. For instance, the sense transistor 212 may be manufactured at the same time and using the same semiconductor fabrication steps as the power transistor 211 and be located very proximate each other on the die. Thus, except for having a smaller gate width (a smaller conductive path) by a factor of N as compared to the power transistor 111, the sense transistor 212 can be expected to behave very close to how the power transistor 211 performs when exposed to the same voltages, signals and environmental conditions.

The current sense die 220 may be formed from a different semiconductor substrate than the power transistor die 210. In one example, the current sense die 220 is a silicon die in which the various components are formed with a silicon active region. For example, the current sense die may provide current sense capability by using metal-oxide-semiconductor field-effect transistors (or MOSFETs).

On the other hand, the power transistor die 210 may be formed by epitaxially depositing an epitaxial stack that includes a heterojunction that induces a 2DEG region proximate the heterojunction. Such is useful in forming power transistors due to the low on-resistance. As an example, the power transistor 211 and the sense transistor 212 may each be high-electron-mobility transistors. As even more specific examples, the power transistor 211 and the sense transistor 212 may each have a heterojunction formed from GaN with AlGaN, or formed from GaAs with AlGaAs, or formed from any other combination of semiconductor materials having suitably different bandgaps sufficient to form a 2DEG region.

The circuit 200 includes circuit terminals 231 through 235, which allow external connection to and from the circuit 200. Specifically, a drain terminal 231 (also referred to as "D") is an example of the input voltage terminal 131 of FIG. 1. A gate terminal 232 (also referred to as "G") is an example of the control drive terminal 132 of FIG. 1. A current sense terminal 233 (also referred to as "CS") is an example of the current sense terminal 133 of FIG. 1. An analog ground terminal 234 (also referred to as "SS") is an example of the low voltage rail terminal 134 of FIG. 1, and is connected to analog ground AGND. A power ground terminal 235 (also referred to as "S") is an example of the power ground terminal 135 of FIG. 1, and is connected to power ground PGND.

The power transistor die 210 has a number of die terminals 241 through 245 that connect the power transistor die 210 to either the current sense die 220 or to one of the circuit terminals 231 through 235. The current sense die 220 has a number of terminals 251 through 255 that connect the current sense die 220 to either the power transistor die 210 or to one of the circuit terminals 231 through 235. Each of the circuit terminals 231 through 235 will now be described.

The gate terminal 232 is connected to the die terminal 241 of the power transistor die 210 and therethrough to the gate terminals of each of the power field-effect transistor 211 and the sense field-effect transistor 212. FIG. 2 shows that a fluctuating control signal (e.g., varying from 0 volts for an off signal to 6 volts for an on signal) is applied as the gate voltage.

The gate terminal 232 is also connected to a die terminal 251 of the current sense die 220. The current sense die 220 includes a fixed gain amplifier 221, which generates a signal that is proportional to the current passing through the power transistor 211. Specifically, the current sense field-effect transistor 212 steers a fraction 1/N of the current passes through the power field-effect transistor 211 into a resistor Rsns. The resistor Rsns converts the sensed current signal into a voltage Vans that is applied across the input terminals of the fixed gain amplifier 221. A small resistance Rsns is chosen to keep Vsns in millivolts so that the terminal drain voltage, source voltage, and gate voltage of the sense field-effect transistor 212 still closely match the respective drain voltage, source voltage, and gate voltage of the power field-effect transistor 211. The fixed gain amplifier 221 then amplifies (for easy readout) the converted voltage Vsns, which results in the output voltage being passed through the die terminal 252, and to the current sense terminal 233.

The current sense die 220 and the fixed voltage amplifier 221 use the gate voltage applied to the gate terminal 232 as a power source instead of having access to a high voltage supply rail. In fact, in the embodiment of FIG. 2, the circuit 200 it its entirety does not access a high voltage supply rail. The way that the fixed voltage amplifier 221 can operate to perform the current sense function even without access to the high voltage supply from a high voltage supply rail will be explained with respect to subsequent drawings. The fixed voltage amplifier 211 is powered by the voltage on the gate terminal 232 and thus only generates the current sense signal when the gate voltage is high.

The drain terminal 231 is connected through the die terminal 242 to the drain terminals of each of the power field-effect transistor 211 and the first sense field-effect transistor 212. The source terminal of the power field-effect transistor 211 is connected via the die terminal 243 to the power ground terminal 235, and is connected via the die terminal 244 to the analog ground terminal 234. The analog ground terminal 235 also serves as a low voltage supply rail that supplies a low voltage (e.g., also referred to as Vss) to the current source 221 via the die terminal 253.

The source terminal of the sense field-effect transistor 212 is connected through the die terminal 245 of the power transistor die 210 to a die terminal 255 of the current sense die 220 and therethrough to the fixed voltage amplifier 221 that acts as a current sense circuit.

LITERAL CLAIM SUPPORT SECTION

Clause 1. A circuit comprising: a power transistor having a power transistor control node that controls whether current flows from a power transistor input node to a power transistor output node; a sense transistor having a sense transistor control node that controls whether current flows from a sense transistor input node to a sense transistor output node, the sense transistor control node connected to the power transistor control node, and the sense transistor input node connected to the power transistor input node; a control drive terminal connected to the power transistor control node and the sense transistor control node; and a current sense circuit connected to the sense transistor control node and configured to detect current passing through the sense transistor, the current sense circuit also connected to the control drive terminal and configured to draw power from the control drive terminal when a high control signal is present on the control drive terminal.

Clause 2. The circuit in accordance with Clause 1, wherein each of the power transistor and sense transistor are manufactured on a semiconductor substrate and each encompass a corresponding part of an epitaxial stack built on the semiconductor substrate.

Clause 3. The circuit in accordance with Clause 2, the semiconductor substrate being a first semiconductor substrate, the current sense circuit being manufactured on a second semiconductor substrate that is different than the first semiconductor substrate.

Clause 4. The circuit in accordance with Clause 3, the first semiconductor substrate and the second semiconductor substrate packaged in a package that does not have a high voltage rail terminal.

Clause 5. The circuit in accordance with Clause 4, the package having an input voltage terminal connected to the power transistor input terminal and the sense transistor input terminal, a control terminal connected to the control terminal drive terminal, a low voltage supply terminal connected to the power transistor output node, and a current sense terminal connected to an output of the current sense circuit.

Clause 6. The circuit in accordance with Clause 5, the low voltage supply terminal connected to the power transistor output node without an intervening resistor element.

Clause 7. The circuit in accordance with Clause 3, the epitaxial stack built upon the first semiconductor substrate comprising a heterojunction that induces a 2DEG region proximate the heterojunction, the current sense circuit comprising a silicon active region.

Clause 8. The circuit in accordance with Clause 3, the power transistor and the sense transistor each being high-electron-mobility-transistors, the current sense circuit comprising metal-oxide-semiconductor field-effect transistors.

Clause 9. The circuit in accordance with Clause 3, the power transistor having a heterojunction formed from GaN with AlGaN, the sense transistor also having a heterojunction formed from GaN with AlGaN.

Clause 10. The circuit in accordance with Clause 3, the power transistor having a heterojunction formed from GaAs with AlGaAs, the sense transistor also having a heterojunction formed from GaAs with AlGaAs.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A circuit comprising:
    a power transistor having a power transistor control node that controls whether current flows from a power transistor input node to a power transistor output node;
    a sense transistor having a sense transistor control node that controls whether current flows from a sense transistor input node to a sense transistor output node, the sense transistor control node connected to the power transistor control node, and the sense transistor input node connected to the power transistor input node, wherein each of the power transistor and sense transistor are manufactured on a semiconductor substrate and each encompass a corresponding part of an epitaxial stack built on the semiconductor substrate, the semiconductor substrate being a first semiconductor substrate, the current sense circuit being manufactured on a second semiconductor substrate that is different than the first semiconductor substrate, the first semiconductor substrate and the second semiconductor substrate packaged in a package that does not have a high voltage rail terminal;
    a control drive terminal connected to the power transistor control node and the sense transistor control node; and
    a current sense circuit connected to the sense transistor control node and configured to detect current passing through the sense transistor, the current sense circuit also connected to the control drive terminal and configured to draw power from the control drive terminal when a high control signal is present on the control drive terminal.

2. The circuit in accordance with claim 1, the package having an input voltage terminal connected to the power transistor input terminal and the sense transistor input terminal, a control terminal connected to the control terminal drive terminal, a low voltage supply terminal connected to the power transistor output node, and a current sense terminal connected to an output of the current sense circuit.

3. The circuit in accordance with claim 2, the low voltage supply terminal connected to the power transistor output node without an intervening resistor element.

4. A circuit comprising:
a power transistor having a power transistor control node that controls whether current flows from a power transistor input node to a power transistor output node;
a sense transistor having a sense transistor control node that controls whether current flows from a sense transistor input node to a sense transistor output node, the sense transistor control node connected to the power transistor control node, and the sense transistor input node connected to the power transistor input node, wherein each of the power transistor and sense transistor are manufactured on a semiconductor substrate and each encompass a corresponding part of an epitaxial stack built on the semiconductor substrate, the semiconductor substrate being a first semiconductor substrate, the current sense circuit being manufactured on a second semiconductor substrate that is different than the first semiconductor substrate, the epitaxial stack built upon the first semiconductor substrate comprising a heterojunction that induces a 2DEG region proximate the heterojunction, the current sense circuit comprising a silicon active region, a control drive terminal connected to the power transistor control node and the sense transistor control node; and
a current sense circuit connected to the sense transistor control node and configured to detect current passing through the sense transistor, the current sense circuit also connected to the control drive terminal and configured to draw power from the control drive terminal when a high control signal is present on the control drive terminal.

5. A circuit comprising:
a power transistor having a power transistor control node that controls whether current flows from a power transistor input node to a power transistor output node;
a sense transistor having a sense transistor control node that controls whether current flows from a sense transistor input node to a sense transistor output node, the sense transistor control node connected to the power transistor control node, and the sense transistor input node connected to the power transistor input node, wherein each of the power transistor and sense transistor are manufactured on a semiconductor substrate and each encompass a corresponding part of an epitaxial stack built on the semiconductor substrate, the semiconductor substrate being a first semiconductor substrate, the current sense circuit being manufactured on a second semiconductor substrate that is different than the first semiconductor substrate, the power transistor and the sense transistor each being high-electron-mobility-transistors, the current sense circuit comprising metal-oxide-semiconductor field-effect transistors, a control drive terminal connected to the power transistor control node and the sense transistor control node; and
a current sense circuit connected to the sense transistor control node and configured to detect current passing through the sense transistor, the current sense circuit also connected to the control drive terminal and configured to draw power from the control drive terminal when a high control signal is present on the control drive terminal.

6. A circuit comprising:
a power transistor having a power transistor control node that controls whether current flows from a power transistor input node to a power transistor output node;
a sense transistor having a sense transistor control node that controls whether current flows from a sense transistor input node to a sense transistor output node, the sense transistor control node connected to the power transistor control node, and the sense transistor input node connected to the power transistor input node, wherein each of the power transistor and sense transistor are manufactured on a semiconductor substrate and each encompass a corresponding part of an epitaxial stack built on the semiconductor substrate, the semiconductor substrate being a first semiconductor substrate, the current sense circuit being manufactured on a second semiconductor substrate that is different than the first semiconductor substrate, the power transistor having a heterojunction formed from GaN with AlGaN, the sense transistor also having a heterojunction formed from GaN with AlGaN, a control drive terminal connected to the power transistor control node and the sense transistor control node; and
a current sense circuit connected to the sense transistor control node and configured to detect current passing through the sense transistor, the current sense circuit also connected to the control drive terminal and configured to draw power from the control drive terminal when a high control signal is present on the control drive terminal.

7. A circuit comprising:
a power transistor having a power transistor control node that controls whether current flows from a power transistor input node to a power transistor output node;
a sense transistor having a sense transistor control node that controls whether current flows from a sense transistor input node to a sense transistor output node, the sense transistor control node connected to the power transistor control node, and the sense transistor input node connected to the power transistor input node, wherein each of the power transistor and sense transistor are manufactured on a semiconductor substrate and each encompass a corresponding part of an epitaxial stack built on the semiconductor substrate, the semiconductor substrate being a first semiconductor substrate, the current sense circuit being manufactured on a second semiconductor substrate that is different than the first semiconductor substrate, the power transistor having a heterojunction formed from GaAs with AlGaAs, the sense transistor also having a heterojunction formed from GaAs with AlGaAs, a control drive terminal connected to the power transistor control node and the sense transistor control node; and
a current sense circuit connected to the sense transistor control node and configured to detect current passing through the sense transistor, the current sense circuit also connected to the control drive terminal and configured to draw power from the control drive terminal when a high control signal is present on the control drive terminal.

* * * * *